United States Patent [19]

Benda et al.

[11] 4,074,303
[45] Feb. 14, 1978

[54] SEMICONDUCTOR RECTIFIER DEVICE

[75] Inventors: Hansjochen Benda; Peter Huber, both of Munich, Germany

[73] Assignee: Siemens Aktiengesellschaft, Berlin & Munich, Germany

[21] Appl. No.: 650,626

[22] Filed: Jan. 20, 1976

[30] Foreign Application Priority Data

Feb. 13, 1975 Germany .............................. 2506102

[51] Int. Cl.² ............................................ H01L 29/00
[52] U.S. Cl. ....................................... 357/33; 357/20; 357/86
[58] Field of Search ............................ 357/20, 33–36, 357/37, 38, 86

[56] References Cited

U.S. PATENT DOCUMENTS

| | | | |
|---|---|---|---|
| 2,971,139 | 2/1961 | Noyce | 357/36 |
| 3,249,831 | 5/1966 | New et al. | 357/38 |
| 3,331,000 | 7/1967 | Moyson et al. | 357/38 |
| 3,476,992 | 11/1969 | Chu | 357/38 |
| 3,599,061 | 8/1971 | Kokosa | 357/38 |
| 3,914,782 | 10/1975 | Nakata | 357/38 |

OTHER PUBLICATIONS

D. Carley et al., "The Overlay Trans., Pt. I: New Geom. Boosts Power," Electronics, Aug. 23, 1965, pp. 71–77.

Primary Examiner—Stanley D. Miller, Jr.
Assistant Examiner—Joseph E. Clawson, Jr.
Attorney, Agent, or Firm—Hill, Gross, Simpson, Van Santen, Steadman, Chiara & Simpson

[57] ABSTRACT

A semiconductor rectifier device including an inner layer of semiconductor material of a first conductivity type and an outer layer of first conductivity type but having a higher doping concentration than the inner layer with the outer layer formed with a plurality of islands of opposite conductivity type which do not extend completely through the outer layer so as to provide a semiconductor rectifier device which has greatly improved resistance to high voltage breakdown particularly in the reverse direction.

3 Claims, 5 Drawing Figures

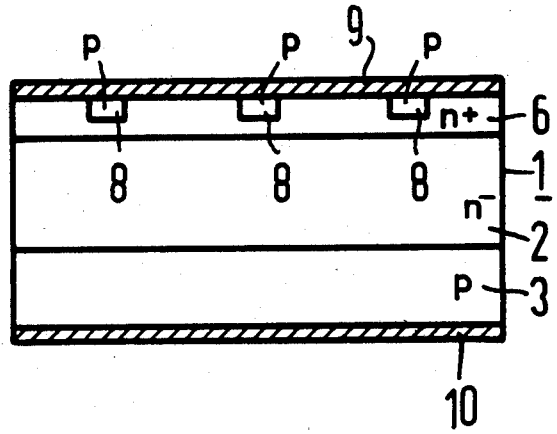

SEMICONDUCTOR RECTIFIER DEVICE

BACKGROUND OF THE INVENTION

1. Field of the Invention

This invention relates in general to semiconductor rectifiers and in particular to an improved rectifier having very high voltage breakdown characteristics.

2. Description of the Prior Art

Semiconductor rectifiers of the prior art have been subject to high voltage breakdown which destroys them particularly when the voltage is applied in the blocking direction and such destruction occurs at voltages which normally would be considered lower than that which would cause such breakdown.

SUMMARY OF THE INVENTION

The present invention relates to a semiconductor rectifier having a first layer of semiconductor material of a first conductivity type and with an adjoining outer layer of a first conductivity type but which possesses a higher degree of doping than the inner layer and with one or a number of second outer regions located in the first outer region of opposite conductivity type which extend only partially through the outer region toward the inner region. A layer of opposite conductivity type is formed on the second side of the first layer of the first conductivity type opposite to the first outer layer and electrodes are formed on the outer surfaces of the two outer layers. Investigations conducted with power rectifiers of this type with surge loads in the blocking direction has shown that prior art power rectifiers are destroyed at power losses in the blocking direction which would normally not be expected to be high enough to cause destruction. Such experiments indicate that in the case of steep blocking current surges high frequency oscillations having frequencies of several hundred MHz can occur. It has been discovered that in power rectifiers where such high frequency oscillations occur that the rectifiers are destroyed at smaller power losses in the blocking direction than comparable power rectifiers in which such oscillations did not occur.

It is an object of the present invention therefore to provide a semiconductor rectifier which substantially prevents or attenuates high frequency oscillations so as to increase the high voltage breakdown.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

BRIEF DESCRIPTION OF THE DRAWINGS

FIGS. 1 through 4 are sectional views through a semiconductor device illustrating various steps during the process of constructing the rectifier, and FIG. 5 is a plan view of the rectifier of the invention with the upper electrode removed.

DESCRIPTION OF THE PREFERRED EMBODIMENTS

The present invention comprises a semiconductor rectifier which has a first outer layer of a first conductivity type in which are formed regions of opposite conductivity type which are distributed over its outer surface and which have a depth which is less than the depth of the first outer layer. Adjoining the first outer layer is a second inner layer of first conductivity type which has weaker doping than the first outer layer. A third layer of opposite conductivity type is formed on the other side of the second layer and a pair of electrodes are mounted on opposite sides of the rectifier.

The regions of opposite conductivity type formed in the first outer layer are expediently formed in a regular pattern. It is advantageous that the area of the regions of opposite conductivity type in the first outer layer be a maximum of 10% or less of the area of the first outer layer.

FIGS. 1 through 4 illustrate various steps in the production of the semiconductor device of the invention and comprise sectional views through the semiconductor device. FIG. 5 is a plan view of the semiconductor rectifier with the upper cathode electrode removed.

As shown in FIG. 1, in the first process step a semiconductor body 1 of a first conductivity type may have a thickness of, for example, 480 micro meters and consist of, for example, weakly n-doped silicon. A p-doped layer 3 having a thickness of about 90 micro meters and an edge concentration of approximately $10^{20}$ atoms/cm$^3$ is produced on one side of the semiconductor element 1 by, for example, diffusion with boron/aluminum. As shown in FIG. 2, the next step consists of forming an n-type zone 4 by diffusing phosphorous into the upper side of the semiconductor element 1. The doping concentration on the surface of the zone 4 is such that it is higher than the doping concentration of the zone 2 and less than the final edge concentration of the finished semiconductor rectifier in the layer 4. It can, for example, be between $10^{17}$ and $10^{18}$ atoms/cm$^3$ when the zone 2 is doped with $1.10^{14}$ concentration and the final edge concentration is for example $1.10^{20}$ atoms/cm$^3$.

FIG. 3 illustrates the next step in the process wherein the surface of layer 4 is provided with a mask 5 which can be formed in a known manner as for example utilizing photo-sensitive lacquer. The mask 5 is applied at those regions which are to be formed of opposite conductivity type in the layer 4. After the mask 5 has been applied, donor material, as for example, phosphorous is additionally diffused into the outer layer 4 until the aforementioned high edge concentration of $1.10^{20}$ atoms/cm$^3$ is obtained. The outer layer 6 illustrated in FIG. 3 is then n+. It contains regions 7 which have a smaller amount of doping which correspond to the doping of the layer 4 because the mask 5 prevents the doping in the region 7 from being as high as that in the layer 6.

As shown in FIG. 4, the next process step is accomplished by removing the mask 5 and diffusing acceptor material as for example aluminum or gallium until the region 7 which are weakly doped in relation to the regions 6 are over-doped and exhibit p-conductivity. The diffusion process of the acceptor material is controlled so that the depth of the p-conducting regions 8 do not extend completely through the depth of the strongly n-doped outer layer 6 as shown in FIG. 4. This can be controlled by using known diffusion parameters during the diffusion process.

The final step in forming the rectifier device is to apply electrodes 9 and 10 on opposite sides of the semiconductor device and then the required edge treatment is accomplished such as bevelling and applying lacquer.

FIG. 5 is a plan view of the finished semiconductor element corresponding to FIG. 4 with the electrode 9 removed. In order to simplify production and to achieve uniform electrical properties over the entire surface of the semiconductor element it is expedient to arrange the regions 8 in the form of a regular pattern in the outer layer 6 as illustrated. For example, as shown in FIG. 5 the regions 8 are formed on vertical and horizontal lines to provide a regular symmetrical pattern. The regions 8 could also be formed on centrally symmetrical patterns comprising concentric circles formed about the center of the device. It is to be realized, however, that any other pattern as desired can be used as, for example, patterns such as used in short circuited emitters of thyristors.

So as to ensure that the reduction in current conducting surface of the semiconductor rectifier is not too limited, the total area of the regions 8 to the total area of the outer layer 6 should not exceed 10%. The depth of the regions 8 can, for example, be 10 micro meters when the depth of the strongly n-doped layer 6 is 20 micro meters.

During blocking operation, when a positive voltage is connected to the electrode 9 and a negative voltage is connected to the electrode 10, the regions 8 will emit positive charged carriers into the strongly n-doped zone 6. These positive charged carriers will pass into the space charged zone in layer 2 and thus attenuate the high frequency oscillations which would occur in the semiconductor element. The high frequency oscillations are attenuated to such an extent that the destruction of the semiconductor rectifier by high frequency oscillations is prevented.

It is seen that this invention provides the arrangement of a plurality of regions of opposite conductivity type in the surface area of a semiconductor rectifier so as to improve the reverse high voltage breakdown characteristic.

Although the invention has been described with respect to preferred embodiments, it is not to be so limited as changes and modifications may be made which are within the full intended scope as defined by the appended claims.

We claim as our invention:

1. A semiconductor diode comprising an interior zone, a first exterior zone connected to the interior zone on one side and has the same conductivity type as said interior zone, said first exterior zone having a higher doping concentration than said interior zone, and with at least a second exterior zone connected to the other side of said interior zone, said second exterior zone being of opposite conductivity type of said interior zone, a first electrode mounted on said first exterior zone, a second electrode mounted on said second exterior zone, areas of opposite conductivity type formed in said first exterior zone and distributed across its surface, said areas having depths which are less than the depth of said first exterior zone, and said first electrode covering and in contact with said areas and said first exterior zone and said areas of opposite conductivity type having a doping concentration which is less than that of said first exterior zone and greater than that of said interior zone.

2. A semiconductor diode according to claim 1 wherein said areas form a symmetrical pattern.

3. A semiconductor diode according to claim 2 wherein said areas do not comprise more than 10% of the total surface of said first exterior zone.

* * * * *